United States Patent
Chakravarti et al.

(10) Patent No.: US 7,361,611 B2
(45) Date of Patent: Apr. 22, 2008

(54) DOPED NITRIDE FILM, DOPED OXIDE FILM AND OTHER DOPED FILMS

(75) Inventors: Ashima B. Chakravarti, Hopewell Junction, NY (US); Judson Holt, Wappingers Falls, NY (US); Kevin K. Chan, Staten Island, NY (US); Sadanand V. Deshpande, Lagrangeville, NY (US); Rangarajan Jagannathan, East Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 11/349,233

(22) Filed: Feb. 8, 2006

(65) Prior Publication Data

US 2006/0138566 A1   Jun. 29, 2006

Related U.S. Application Data

(62) Division of application No. 10/710,245, filed on Jun. 29, 2004.

(51) Int. Cl.
*H01L 21/31* (2006.01)

(52) U.S. Cl. .................. 438/778; 438/783; 438/787; 438/791

(58) Field of Classification Search .......... 438/778, 438/783, 787, 791; 427/255.394, 576
See application file for complete search history.

(56) References Cited

U.S. PATENT DOCUMENTS

| | | | | |
|---|---|---|---|---|
| 4,126,880 A | * | 11/1978 | Tamaki et al. | 257/633 |
| 5,347,100 A | * | 9/1994 | Fukuda et al. | 257/760 |
| 6,306,722 B1 | * | 10/2001 | Yang et al. | 438/424 |
| 6,930,058 B2 | * | 8/2005 | Hill et al. | 438/783 |
| 2004/0029323 A1 | * | 2/2004 | Shimizu et al. | 438/142 |
| 2004/0198069 A1 | * | 10/2004 | Metzner et al. | 438/785 |

FOREIGN PATENT DOCUMENTS

JP    56-169333    12/1981

* cited by examiner

*Primary Examiner*—Hsien-Ming Lee
(74) *Attorney, Agent, or Firm*—Whitham, Curtis, Christofferson & Cook, PC; Yuanmin Cai

(57) ABSTRACT

Adding at least one non-silicon precursor (such as a germanium precursor, a carbon precursor, etc.) during formation of a silicon nitride, silicon oxide, silicon oxynitride or silicon carbide film improves the deposition rate and/or makes possible tuning of properties of the film, such as tuning of the stress of the film. Also, in a doped silicon oxide or doped silicon nitride or other doped structure, the presence of the dopant may be used for measuring a signal associated with the dopant, as an etch-stop or otherwise for achieving control during etching.

14 Claims, 4 Drawing Sheets

DOPED NITRIDE FILM, DOPED OXIDE FILM AND OTHER DOPED FILMS

RELATED APPLICATION

This application is a divisional of application Ser. No. 10/710,245 filed Jun. 29, 2004.

BACKGROUND OF INVENTION

The present invention generally relates to films used in manufacture of semiconductor devices, especially to nitride films and oxide films.

In order to improve drive current in complementary metal oxide semiconductor (CMOS) devices, stressed films have been used either as spacers or middle-of-the-line (MOL) liners (also known as pre-metal dielectric (PMD) liners). Deposition regimes that result in either highly tensile or highly compressive nitride films are well known (e.g., rapid thermal chemical vapor deposition (RTCVD), plasma enhanced chemical vapor deposition (PECVD), high density plasma (HDP) using silicon (Si) precursor such as silane ($SiH_4$), di chloro silane (DCS), Disilane, Hexachlorosilane, and bis-tertiary butyl amino silane (BTBAS). However, within a given deposition regime it only has been possible to modulate the stress within a small range. It has been very difficult to modulate the stress to a large extend without compromising the film quality.

Also, there has been a growing need for nitride/oxide films deposited at a lower temperature for MOL driven by the introduction of nitride silicon (NiSi) processes. Many low temperature precursors have been investigated, and none has turned out to be ideal.

Typically, in an LPCVD furnace, DCS and $NH_3$ are used for depositing silicon nitride film at temperatures of 700 C and higher.

SUMMARY OF INVENTION

It is therefore an object of the present invention to provide increased deposition rate compared to conventional processes, thus providing for more manufacturable films, especially silicon nitride films, silicon oxide films, silicon oxynitride films, and silicon carbide films.

Another object of the present invention is to provide the ability to produce good quality nitride films of varying stress levels, thus enhancing device performance as a "plug-in" solution, i.e., with no integration changes needed.

Another object of the present invention is to lower the temperature for deposition of a silicon nitride film, a silicon oxide film, a silicon oxynitride film or a silicon carbide film.

A further object of the present invention is to manipulate germanium addition during production of a silicon nitride film, silicon oxide film, silicon oxynitride film or silicon carbide film, to control stress in the produced film.

The present invention, in one preferred embodiment which is a process in which at least one Si precursor is deposited, at least one Ge precursor and/or at least one C precursor is added, to produce a Ge- and/or C-doped silicon nitride or silicon oxide film with a tunable stress.

Thus, at least one chemical or physical property (such as a stress property) of a silicon nitride or a silicon oxide film being produced may be tuned by at least one precursor modification during deposition of the film.

Advantageously, lower-than-conventional temperature deposition can be obtained in depositing a silicon nitride, silicon oxide, silicon oxynitride or silicon carbide film according to the present invention.

The invention in one preferred embodiment provides a method of producing a doped nitride film, a doped oxide film, a doped oxynitride film or a doped carbide film, the method comprising at least: providing at least one silicon precursor (such as, e.g., $SiH_4$, DCS, BTBAS, HCD, disilane, trisilane, etc.); providing at least one of: a nitrogen precursor (which may be the same as or different from the silicon precursor) or an oxygen precursor in the case of forming silicon nitride, silicon oxide, or silicon oxynitride films; and further providing at least one non-silicon precursor;

wherein a doped silicon nitride film, doped silicon oxide film, doped silicon oxynitride film or doped silicon carbide film is formed (provided that when the film is a doped oxide, the non-silicon precursor is not boron and not phosphorous).

Examples of the non-silicon precursor for use in the inventive method are, e.g., a germanium (Ge) precursor (such as, e.g., an organogermanium compound, etc.; $GeH_4$, $GeH_3CH_3$ etc.), a carbon precursor (such as, e.g., $C_2H_4$, etc.); diborane; an aluminum (Al) precursor (such as, e.g., trimethyl aluminum (TMA), $AlH_3$, aluminum isopropoxide etc.); a boron (B) precursor; an arsenic precursor; a hafnium precursor; a gallium precursor (such as trimethyl Ga, trialkyl amino Ga, $GaH_3$, etc.); an indium precursor (such as trimethyl In, trialkyl amino In, $InH_3$, etc.); etc. Additionally, alkyl hydrides or alkyl amino hydrides of germanium, carbon, boron, aluminum, aluminum, arsenic, hafnium, gallium, indium, etc., may be used as precursors. In a particularly preferred example of an inventive method, the providing of at least one silicon precursor and the providing of at least one non-silicon precursor occurs simultaneously and is in a form of providing flow of a gas.

The inventive methods may be used for producing a variety of doped films, such as, e.g., a germanium- and/or carbon-doped silicon nitride or silicon oxide or silicon oxynitride or silicon carbide; etc.; a silicon nitride, a silicon oxide, a silicon oxynitride or a silicon carbide film with a tunable stress; a doped silicon nitride film having a uniformly distributed dopant concentration (such as, e.g., a Ge-doped silicon nitride film having a uniformly distributed Ge concentration); etc. One example of a method according to the invention is, e.g., adding germane (a germanium precursor) to a mixture of silane and ammonia, and forming a Ge-doped Si nitride film.

In a further preferred embodiment of an inventive method, a precursor modification (such as, e.g., a mixture of at least two precursors, etc.) may be applied to tune at least one chemical or physical property of a produced film (such as, e.g., stress of a produced film, wet etch rate; dry etch rate; etch end point; deposition rate; physical, electrical and/or optical property; etc.).

The inventive method optionally may further comprise a step of measuring a signal for a non-silicon dopant from the non-silicon precursor, said signal measuring for controlling an etch.

In certain embodiments of inventive methods, deposition advantageously may be at a lower temperature than if the non-silicon precursor were omitted, such as, e.g., a deposition temperature below about 700° C. (including but not limited to a deposition temperature as low as room temperature), etc. Preferred examples of depositions in which the inventive method may be used are, e.g., RTCVD, PECVD, LPCVD, remote plasma nitride, atomic layer deposition (ALD), etc.

The invention in other preferred embodiments provides certain films, such as, e.g., a silicon nitride, silicon oxide, silicon oxynitride or silicon carbide film (such as, e.g., a germanium-doped film, etc.), having a tunable stress in a range of about 3 G Pa (compressive) to 3 G Pa (tensile); a silicon nitride film, wherein the film is a Ge-doped silicon nitride film with uniformly distributed Ge; an aluminum-doped silicon oxide film; a germanium-doped silicon nitride film; etc.; a Ge-doped film wherein the Ge-doped film has a stress that is at least about 1.0 G Pa greater (preferably, 1.2 G Pa greater) than a film that has been made by a same process except without Ge-doping.

Inventive films may include one or more dopants, such as a multitude of dopants. Examples of dopants for use in inventive films include, e.g., germanium (Ge), carbon (C), boron (B), aluminum (Al), gallium (Ga), indium (In), etc., which dopants may be used singly or in combination.

BRIEF DESCRIPTION OF DRAWINGS

The foregoing and other objects, aspects and advantages will be better understood from the following detailed description of a preferred embodiment of the invention with reference to the drawings, in which.

DETAILED DESCRIPTION

Figure 1:
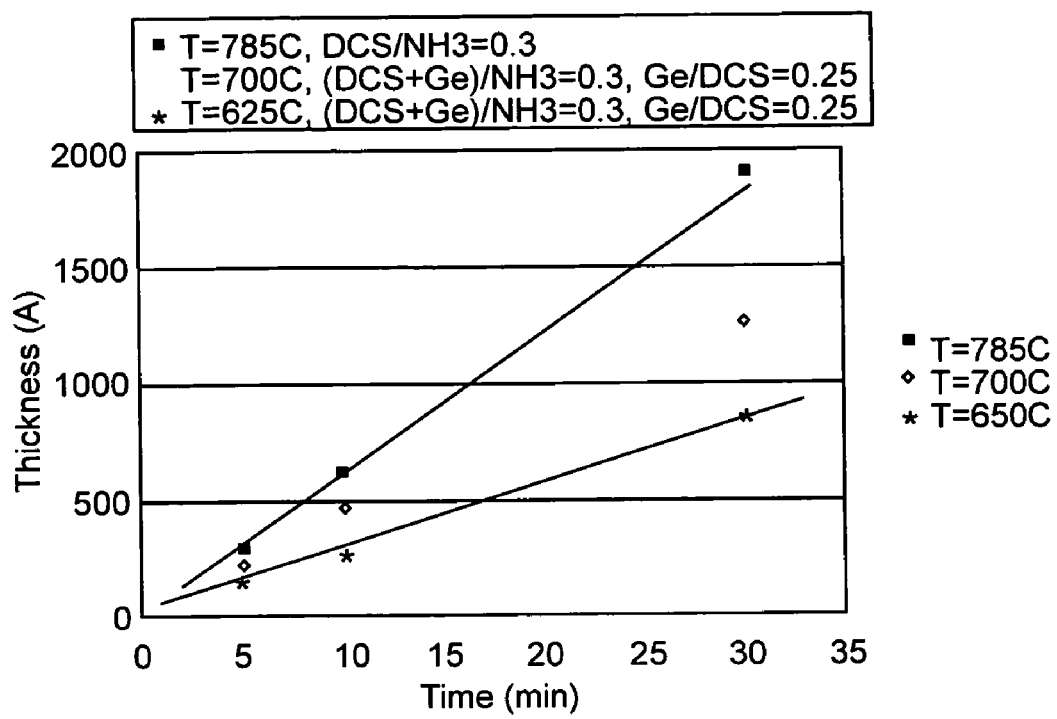
FIG. 1 is a chart of ellipsometry measurements (49 points) for one silicon nitride film and two LPCVD SiGe Nitride films.

In the present invention, during production of a doped nitride film, a doped oxide film, a doped oxynitride film or a doped carbide film, at least one of the following is manipulated: the deposition rate; a chemical and/or physical property (such as, e.g., tunable stress) of the formed film. This manipulation is accomplished by introducing an additional non-silicon precursor that is otherwise not a traditional reagent for producing a nitride film, an oxide film, an oxynitride film, or a carbide film, with examples of the additional non-silicon precursor being a germanium precursor and a carbon precursor.

The present invention accomplishes such advantages by including a non-silicon precursor dopant (such as, e.g., a Ge precursor, etc.) during the deposition process, such as deposition of a silicon nitride film, deposition of a silicon oxide film, deposition of a silicon oxynitride film, deposition of a silicon carbide film, etc.

For example, in one embodiment, the present invention makes possible low-temperature deposition of a nitride film, an oxide film, an oxynitride film and/or a carbide film, by adding germanium to deposition of nitride films and oxide films and oxynitride films and carbide films, especially doped nitride or oxide films. The present inventors exploit the fact that silicon germanium (SiGe) epitaxy can be done at a lower temperature than silicon epitaxy, and further have discovered that the addition of a germanium (Ge) precursor to a silicon precursor lowers the temperature of the deposition of the film.

A germanium precursor used in the present invention may be, e.g., a known germanium precursor such as the germanium precursors mentioned, e.g., in U.S. Pat. No. 6,429,098 issued Aug. 6, 2002 and U.S. Pat. No. 6,117,750 issued Sep. 12, 2000 to Bensahel et al. (France Telecom) or in U.S. Pat. No. 6,258,664 issued Jul. 10, 2001 to Reinberg (Micron Technology, Inc.). Germanium precursors are commercially available. An example of a germanium precursor used in the invention is $GeH_4$.

The present invention provides for use of at least one germanium precursor in deposition of a silicon nitride, a silicon oxide, a silicon oxynitride, a silicon carbide, etc., which deposition advantageously may, if desired, by a low-temperature deposition, such as, e.g., a deposition at 700° C. or lower, such as, e.g., room temperature and other temperatures. In a preferred example, an inventive method may proceed at room temperature in a P3i plasma immersion tool, to deposit nitride.

When including the non-silicon precursor in the present invention for producing a silicon nitride or silicon oxide film or silicon oxynitride film or silicon carbide film, the production process otherwise may proceed conventionally with regard to ingredients, for example, use of a nitrogen precursor (such as, e.g., $NH_3$, etc.) and a silicon precursor (such as DCS, etc.), etc. For producing a silicon nitride film, a nitrogen precursor is included. For producing a silicon oxide film, an oxygen precursor is included. For producing a silicon nitride or a silicon oxide film, a silicon precursor is included. It will be appreciated that the silicon precursor may be different or the same as the nitride or oxide precursor. For example, BTBAS may serve as a silicon precursor and a nitrogen precursor. In the present invention, in some embodiments a reagent (such as, e.g., BTBAS, etc.) optionally may be used as two or more kinds of precursors.

An exemplary temperature for nitride or oxide or oxynitride or carbide film forming using a germanium precursor and/or a carbon precursor according to the invention is preferably at a temperature less than 700° C., more preferably at a temperature less than 650° C., even more preferably at a temperature of 500° C. or lower. For example, in the case of Ge-doping, an advantageous temperature of 500° C. or lower may be used for the deposition of a Ge-doped silicon nitride film. It will be appreciated that, while the present invention advantageously makes possible relatively low deposition temperatures that are desirable, low deposition temperatures are not necessarily required to be used in all embodiments, such as, for example, a film may be advantageously stress-tuned according to the invention at a variety of deposition temperatures.

The non-silicon precursor mentioned for use in the present invention is not particularly limited, and as examples may be mentioned a germanium precursor, a carbon precursor, an aluminum precursor, a boron precursor, an arsenic precursor, a hafnium precursor, a gallium precursor, an indium precursor, and, without limitation, other dopant precursors, etc.

The present invention also may be applied to MOL barrier technology. For example, it is well known that the MOL barrier nitride can enhance device reliability (negative bias temperature instability (NBTI), etc.). The present invention provides, through use of the germanium precursor and/or the carbon precursor, an ability to tune the chemical and/or physical properties of the barrier nitride film using different precursor combinations. Such an ability may be used to achieve a significant device reliability gain.

Thickness of a film produced according to the present invention is not particularly limited, and a thickness may be selected depending on the application. The film thickness may range from, on the thin end (such as, e.g., a film of 500 Angstroms, or of 10 Angstroms, or thinner), to the thick end (such as, e.g., a film of 1,000 Angstroms, or a film of 5,000 Angstroms, or thicker), and thicknesses in between, such as films in a range of about 10 to 5,000 Angstroms, and thinner or thicker as called for by the application.

The dopant concentration of a film made according to the invention is not particularly, and may be adjusted as desired. An example of a dopant (such as Ge, etc.) concentration is in a range of, e.g., about 1 to 10%, or, in another example, about 1 to 50%.

The present invention includes an embodiment in which multiple non-silicon precursors are used, such as a germanium precursor and a carbon precursor; a germanium precursor and a boron precursor; etc. For example, adding multiple precursors during deposition of a silicon nitride or a silicon oxide film may provide an enhanced effect, as may be desired.

The present invention may be used, e.g., for signaling an etch end point. For example, when conventional silicon nitride etching is performed, there has been a problem with wanting to stop the etch at the end of the silicon nitride and not etch over onto the silicon. However, such an etch end point many times has not been sharp and etching into the silicon has been common with the conventional methods. With the present invention, if a doped silicon nitride is used (such as a Ge-doped silicon nitride), the presence of the Ge in the silicon nitride may be used to signal the endpoint of the etch, thereby advantageously preventing over-etching, such as, e.g., by using optical emission spectroscopy to detect the Ge (e.g., a Ge-Fluoride signal may be searched-for).

Such an aforementioned etch-stop example is not limiting, and the invention is extended to a variety of signaling uses of a dopant in a doped nitride film or a doped oxide film. For example, there may be provided a thin silicon nitride layer doped as an etch stop layer (such as a Ge-doped silicon nitride layer, etc.), and the dopant signal (e.g., the Ge signal, etc.) may be monitored for determining where the layer begins. A number of different implementations of the present invention may be provided, in the etching context. Another example is a thin layer of carbon or boron doped oxide under a Ge-doped nitride. For such a structure, drop in Ge signal and advent of C signal can be monitored, for better etching results. A further example of using the invention in an etching process is use of two different dopants, such as providing one dopant in each of the respective layers, or providing the two different dopants in a same layer. It will be appreciated that the present invention includes use of different signals being controlled for maximal sensitivity, and that the above-mentioned are only some examples.

Another use of the present invention is to change stress of a produced film (e.g., a silicon nitride, silicon oxide) by including a dopant, compared to a film in which the dopant is not included. For example, for a case of a silicon nitride film, inclusion of a Ge dopant has been found to change stress of the film to the tensile region. Conventionally, RTCVD silicon nitride films have a stress of about 1 to 1.5 G Pa (tensile). Including Ge in the silicon nitride films provides a significant change raising the stress of the film, such as a doped Ge-silicon nitride film with a stress exceeding 1.5 G Pa (tensile), such as a stress of 2 G Pa (tensile), or higher, etc. When measuring a film doped according to the invention and a comparable non-doped film on the same stress tool, a delta of 1 G Pa or greater (preferably, such as a delta of 1.2 G Pa or greater) may be obtained in the doped film. Also, the present invention may be used to change the stress of a film from compressive to tensile, which signifies a significant change in the nature of a film.

Thus, the present invention advantageously may be used to tune stress of a silicon nitride or silicon oxide film or silicon oxynitride or silicon carbide film as desired.

Also, the present invention may be used to produce doped silicon nitride films, doped silicon oxide films, doped silicon oxynitride films, and doped silicon carbide films, such as, e.g., a Ge-doped silicon nitride film, an Al-doped silicon oxide film, a boron-doped silicon nitride film, etc.

EXAMPLE 1

In an LPCVD furnace, $GEH_4$ was added to a mixture of DCS and $NH_3$ at two different temperatures, 700 and 650° C. respectively. A standard silicon nitride film was also deposited at 785° C. as a control. Two germanium-doped silicon nitride films and one standard silicon nitride film were thus deposited. The results are summarized in the charts which are FIGS. 1, 2 and 3.

Figure 2:
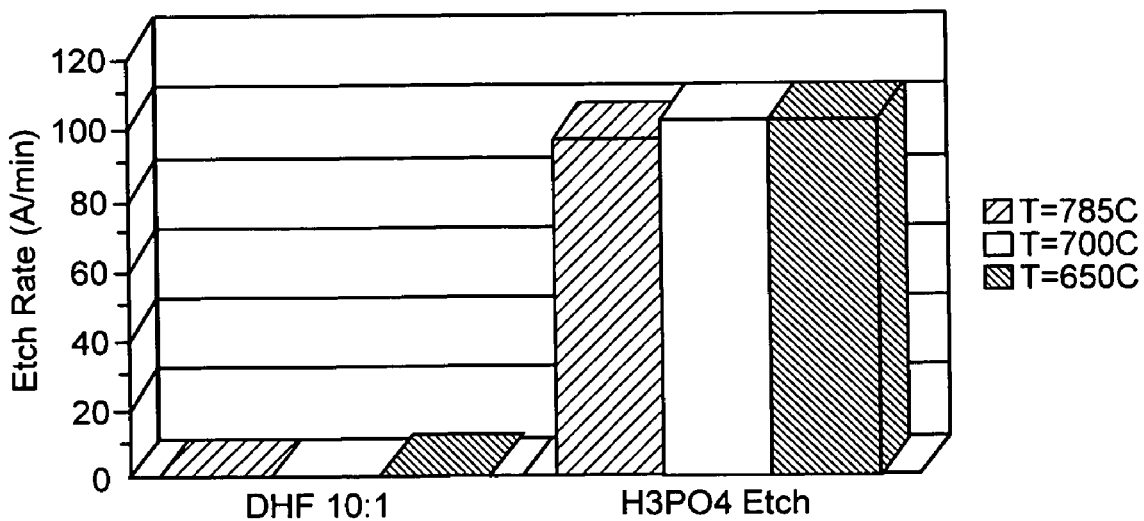
FIG. 2 is a chart of etch rate of one silicon nitride film and two SiGe nitride films, based on ellipsometry, 49 points, with FIG. 2 relating to the films charted in FIG. 1.

In FIG. 1, the top plot is for the film deposited at 785° C., with $DCS/NH_2=0.3$ The middle plot in FIG. 1 is for the film deposited at 700° C., with $(DCS+Ge)/NH_3=0.3$, Ge/DCS=0.25. The bottom plot in FIG. 1 is for the film deposited at 650° C., with the same ratios as for the film deposited at 700° C.

Figure 3:
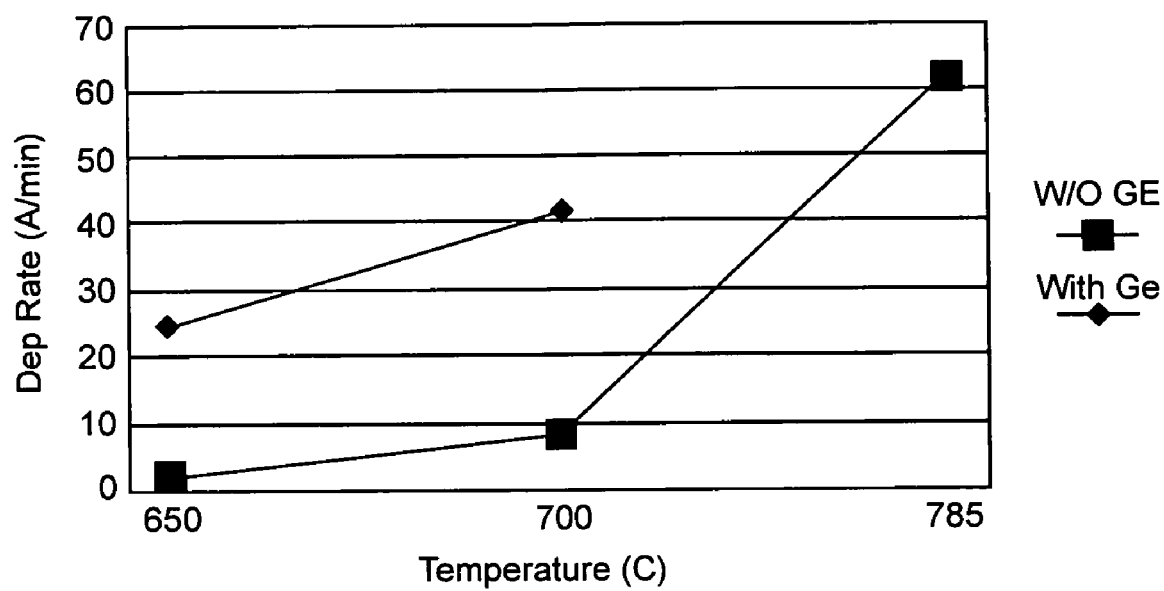
FIG. 3 is a chart of deposition rate as function of Ge incorporation, with plots for with and without Ge, with FIG. 3 relating to the films charted in FIG. 1.

From FIG. 3, it is clear that by adding $GeH_4$ to the process gas, a significant increase in the deposition rate has been achieved. Also, the germanium-doped films of this Example 1 have a similar property (determined by wet etch rate) to the standard high temperature films.

The addition of germane to a mixture of a silicon precursor and ammonia allows for: Increasing the deposition rate of an existing process making the process more manufacturable; lowering the deposition rate of a process to make it extendable to future technology; and/or manipulating stress of the formed film.

EXAMPLE 2

Importantly, the present Inventors have recognized that stress in a film may be modified by germanium addition during nitride film formation. There may be considered the following results, both for silicon substrates: (i) for a Si—N film, stress of 4 E9 Dyne/$cm^2$ (compressive); (ii) for a SiGe—N film, stress of 8.2 E9 Dyne/cm (tensile).

As the above data shows, there is almost an order of magnitude stress difference between a conventional silicon nitride film and an inventive germanium-doped silicon nitride film.

It will be appreciated that the advantages of the present invention with regard to deposition rate and/or stress tuning are not limited to nitride films, and may be applicable for oxide films (such as silicon oxide films, etc.) and other films, such as other amorphous films.

EXAMPLE 3

Ge was added to a mixture of silane and ammonia, forming a Ge-doped Si nitride film. The deposition rate was increased for the germane process, compared to an equivalent no-germane process. For the no-Ge processs, the stress of the produced film was 0.4 GPa (compressive). For the inventive process using Ge, the stress was 0.8 GPa (tensile). Thus, the use of Ge according to the invention achieved a change in stress of 1.2 GPa, which was a substantial improvement.

EXAMPLE 4

Figure 4:
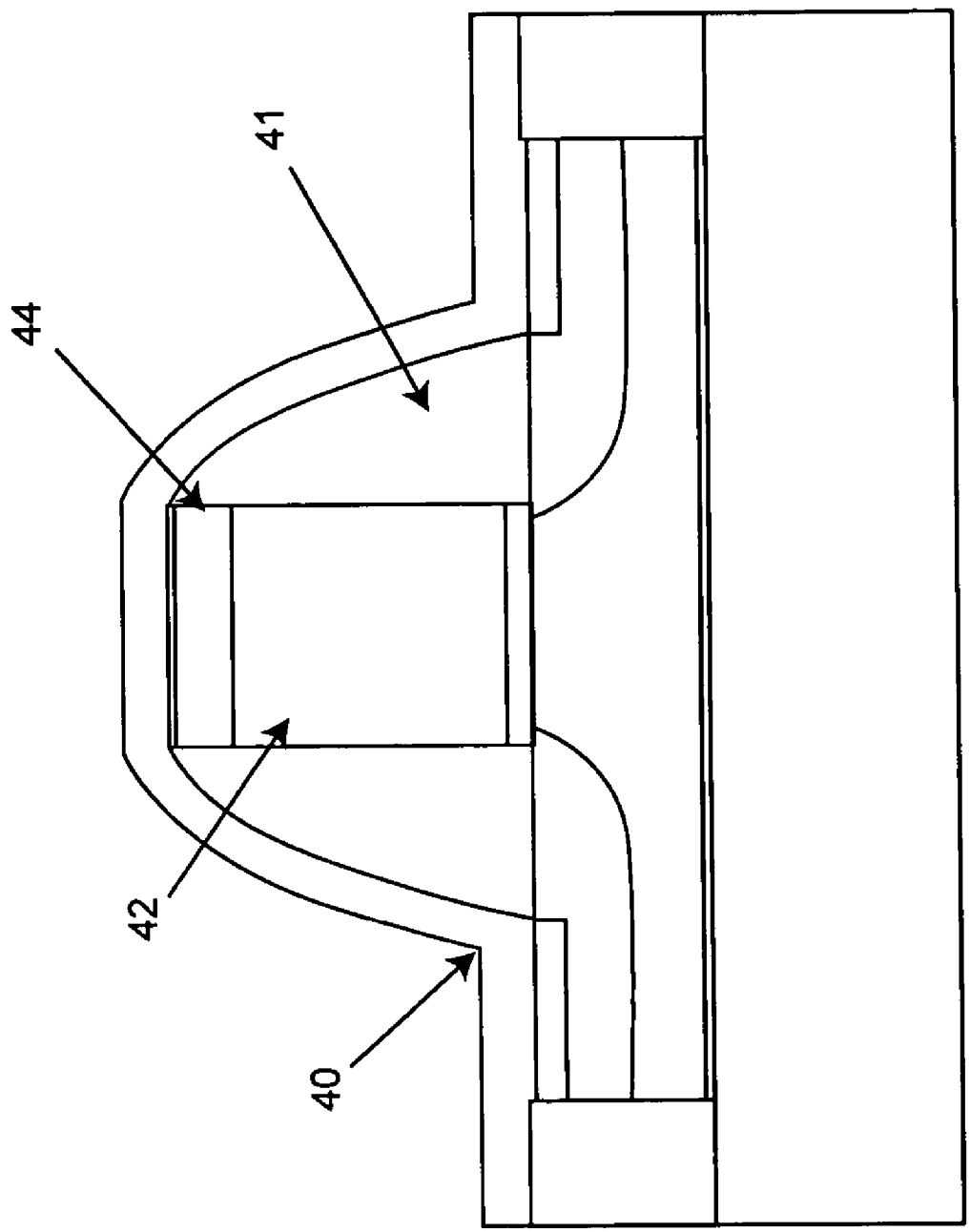
FIG. 4 is a side view showing a stressed liner according to an embodiment of the invention, with the stressed liner in use with a spacer, a gate and a channel.

With reference to FIG. 4, an example of a stressed film according to one embodiment of the invention is shown. Stressed nitride liner 40 (produced according to the invention) is shown in use with spacer 41, gate (POLY) with layer 44 (silicide), with the gate being over a channel (SOI).

EXAMPLE 5

Figure 5A:
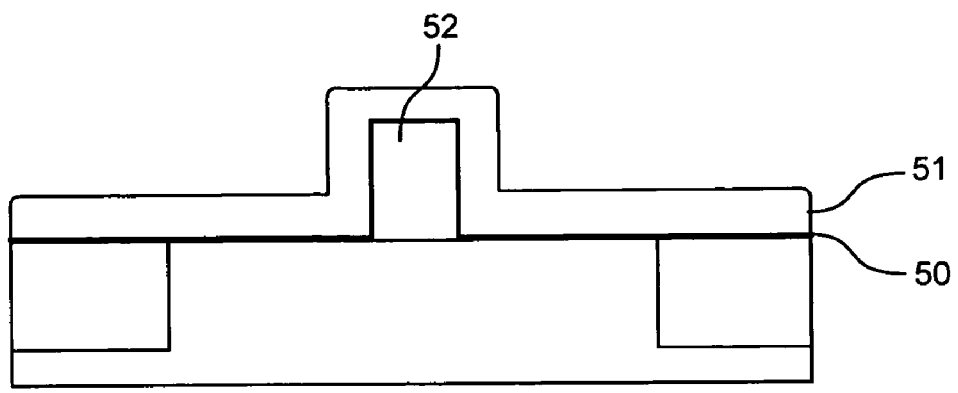
FIGS. 5A-5C depict an endpoint detection method according to an embodiment of the invention.
Figure 5B:
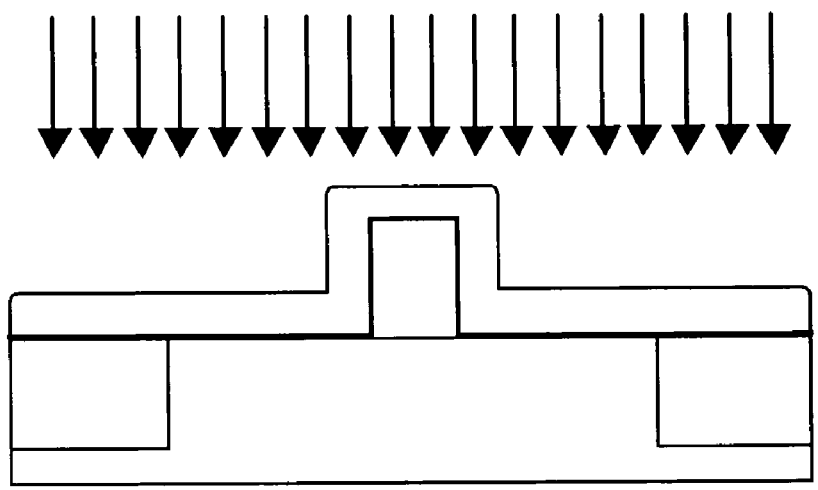
Figure 5C:
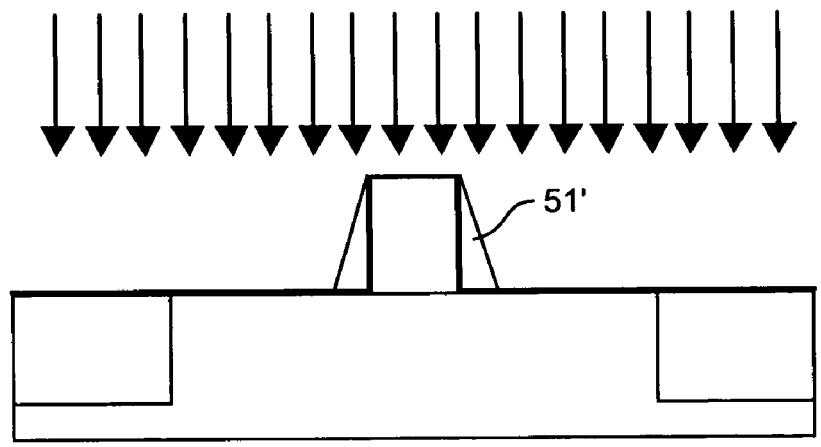

With reference to FIGS. 5A-5C, an example of a counter-doped nitride or oxide layer for endpoint detection according to the invention is shown. Referring to FIG. 5A, in a device including gate 52, a spacer nitride 51 (with a first dopant) is provided over a nitride or oxide layer 50 (with a second dopant). The as-deposited films of FIG. 5A are processed according to an initial RIE step shown in FIG. 5B, wherein during initial RIE, the first dopant is detected. Next, a step of final RIE is performed, as shown in FIG. 5C, wherein an etch endpoint is reached. During the final RIE step, a smaller amount of the first dopant (in the spacer nitride 51 or etched spacer nitride 51') is detected, and detection of the second dopant (in the nitride or oxide layer 50) begins. After the etch endpoint step, a controllably etched spacer nitride 51' remains.

While the invention has been described in terms of its preferred embodiment, those skilled in the art will recognize that the invention can be practiced with modification within the spirit and scope of the appended claims.

The invention claimed is:

1. A method of producing a doped silicon nitride film, doped silicon oxide film, doped silicon oxynitride film or doped silicon carbide film, comprising:
   providing at least one silicon precursor,
   in the case of a doped silicon nitride film, doped silicon oxide film or doped silicon oxynitride film, providing at least one of a nitrogen precursor or an oxygen precursor,
   providing at least one non-silicon precursor, and
   forming a doped silicon nitride film, a doped silicon oxide film, a doped silicon oxynitride film or a doped silicon carbide film having a stress tuned to a selected level from said at least one silicon precursor and said at least one non-silicon precursor, and in the case of a doped silicon nitride film, doped silicon oxide film or doped silicon oxynitride film, said nitrogen precursor or said oxygen precursor, provided that when the film is a doped silicon oxide, the non-silicon precursor is neither boron nor phosphorous,
   wherein the providing steps are performed by deposition and the deposition is conducted at room temperature.

2. The method of claim 1, wherein the providing of at least one silicon precursor and the providing of at least one non-silicon precursor occurs simultaneously and is in a form of providing flow of a gas.

3. The method of claim 1, wherein the non-silicon precursor is a germanium precursor.

4. The method of claim 1, wherein the non-silicon precursor is selected from the group consisting of a carbon precursor, a boron precursor, an aluminum precursor, an arsenic precursor, a hafnium precursor, a gallium precursor and an indium precursor.

5. The method of claim 1, wherein the doped silicon nitride film is doped with germanium or carbon.

6. The method of claim 1, wherein the non-silicon precursor is an organogermanium compound or a germanium precursor selected from the group consisting of $GeH_4$, $GeH_3CH_3$, diborane, trimethyl aluminum (TMA), a $C_2H_2$ carbon precursor, trimethyl Ga, trimethyl In, trialkyl amino Ga, trialkyal amino In, $GaH_3$ $InH_3$, $AlH_3$, and aluminum isopropoxide.

7. The method of claim 1, wherein said providing steps are performed by deposition and the deposition is RTCVD, PECVD, LPCVD, remote plasma nitride or ALD.

8. The method of claim 1, further comprising a step of measuring a signal for a non-silicon dopant from the non-silicon precursor, said signal measuring for controlling an etch end point.

9. A method of producing a doped silicon nitride film, doped silicon oxide film, doped silicon oxynitride film or doped silicon carbide film, comprising:
   providing at least one silicon precursor,
   in the case of a doped silicon nitride film, doped silicon oxide film or doped silicon oxynitride film, providing at least one of a nitrogen precursor or an oxygen precursor, and
   providing at least one non-silicon precursor, wherein the non-silicon precursor is an alkyl hydride or an alkyl amino hydride of germanium, carbon, aluminum, boron, arsenic, hafnium, gallium or indium,
   wherein a doped silicon nitride film, a doped silicon oxide film, a doped silicon oxynitride film or a doped silicon carbide film is formed, provided that when the film is a doped silicon oxide, the non-silicon precursor is neither boron nor phosphorous.

10. A method of producing a doped silicon nitride film, doped silicon oxide film, doped silicon oxynitride film or doped silicon carbide film, comprising:
    providing at least one silicon precursor,
    in the case of a doped silicon nitride film, doped silicon oxide film or doped silicon oxynitride film, providing at least one of a nitrogen precursor or an oxygen precursor, and
    providing at least one non-silicon precursor,
    applying a precursor modification to tune at least one physical property of a produced film,
    wherein a doped silicon nitride film, a doped silicon oxide film, a doped silicon oxynitride film or a doped silicon carbide film is formed, provided that when the film is a doped silicon oxide, the non-silicon precursor is neither boron nor phosphorous, and wherein one or more of the following is present
    a) the precursor modification is a mixture of at least two precursors,
    b) the at least one physical property is stress of a produced film, and
    c) the at least one physical property is selected from the group consisting of wet etch rate, dry etch rate, etch end point, deposition rate, and electrical and/or optical property.

11. The method of claim 10, wherein the precursor modification is a mixture of at least two precursors.

12. The method of claim 10, wherein the at least one physical property is stress of a produced film.

13. The method of claim 10, wherein "c" is present.

14. A method of producing a doped silicon nitride film, doped silicon oxide film, doped silicon oxynitride film or doped silicon carbide film, comprising:
provide at least one silicon precursor,
in the case of a doped silicon nitride film, doped silicon oxide film or doped silicon oxynitride film, providing at least one of a nitrogen precursor or an oxygen precursor, and
providing at least one non-silicon precursor,
wherein a doped silicon nitride film, a doped silicon oxide film, a doped silicon oxynitride film or a doped silicon carbide film is formed, provided that when the film is a doped silicon oxide, the non-silicon precursor is neither boron nor phosphorous, and
wherein the providing steps are performed by deposition and the deposition is at a lower temperature than if the non-silicon precursor were omitted.

* * * * *